(12) United States Patent
Mills et al.

(10) Patent No.: US 8,912,426 B2
(45) Date of Patent: Dec. 16, 2014

(54) PHOTOVOLTAIC DEVICE

(75) Inventors: Michael E. Mills, Midland, MI (US);
James R. Keenihan, Midland, MI (US);
Kevin D. Maak, Midland, MI (US);
Narayan Ramesh, Midland, MI (US);
Jason A. Reese, Auburn, MI (US);
James C. Stevens, Richmond, TX (US);
Samar R. Teli, Howell, MI (US)

(73) Assignee: Dow Global Technologies LLC, Midland, MI (US)

( * ) Notice: Subject to any disclaimer, the term of this patent is extended or adjusted under 35 U.S.C. 154(b) by 225 days.

(21) Appl. No.: 13/044,593

(22) Filed: Mar. 10, 2011

(65) Prior Publication Data

US 2011/0220183 A1     Sep. 15, 2011

Related U.S. Application Data

(60) Provisional application No. 61/313,310, filed on Mar. 12, 2010.

(51) Int. Cl.
*H01L 31/042*     (2014.01)
*H01L 31/05*     (2014.01)
*H01L 31/048*     (2014.01)

(52) U.S. Cl.
CPC ............ *H01L 31/0483* (2013.01); *H01L 31/05* (2013.01); *Y02E 10/50* (2013.01); *H01L 31/0481* (2013.01); *Y02B 10/12* (2013.01)
USPC ........................................................ 136/244

(58) Field of Classification Search
CPC ............ H01L 31/0482; H01L 31/0483; H01L 31/0484; F24J 2/4636; F24J 2/5235; F24J 2002/5224

USPC .................................................. 136/243–265
See application file for complete search history.

(56) References Cited

U.S. PATENT DOCUMENTS

| | | | |
|---|---|---|---|
| 3,767,471 A | 10/1973 | Kasper | |
| 4,321,416 A | 3/1982 | Tennant | |
| 4,465,575 A | 8/1984 | Love et al. | |
| 5,180,442 A | * 1/1993 | Elias | ............................ 136/251 |
| 5,437,735 A | 8/1995 | Younan et al. | |
| 5,575,861 A | 11/1996 | Younan | |
| 5,590,495 A | 1/1997 | Bressler | |
| 5,986,203 A | 11/1999 | Hanoka et al. | |

(Continued)

FOREIGN PATENT DOCUMENTS

| | | |
|---|---|---|
| EP | 841706 A2 | 5/1998 |
| EP | 1032051 A2 | 8/2000 |

(Continued)

OTHER PUBLICATIONS

Dupont Tefzel Properties Handbook, published by DuPont, Nov. 2003, retrieved online Oct. 27, 2012 from http://www2.dupont.com/Teflon_Industrial/en_US/assets/downloads/h96518.pdf.*

(Continued)

*Primary Examiner* — Jeffrey T Barton
*Assistant Examiner* — Eric R Smith

(57) ABSTRACT

The present invention is premised upon an improved photovoltaic device ("PV device"), more particularly to an improved photovoltaic device with a multilayered photovoltaic cell assembly and a body portion joined at an interface region.

19 Claims, 10 Drawing Sheets

(56) References Cited

U.S. PATENT DOCUMENTS

| | | | |
|---|---|---|---|
| 5,990,414 A | 11/1999 | Posnansky | |
| 6,066,796 A * | 5/2000 | Itoyama et al. | 136/251 |
| 6,248,271 B1 * | 6/2001 | Graham et al. | 264/39 |
| 6,462,265 B1 * | 10/2002 | Sasaoka et al. | 136/251 |
| 6,840,799 B2 | 1/2005 | Yoshikawa et al. | |
| 6,875,914 B2 | 4/2005 | Guha et al. | |
| 7,365,266 B2 | 4/2008 | Heckeroth | |
| 7,658,055 B1 * | 2/2010 | Adriani et al. | 53/475 |
| 2005/0011550 A1 | 1/2005 | Chittibabu et al. | |
| 2007/0193618 A1 * | 8/2007 | Bressler et al. | 136/244 |
| 2007/0256734 A1 | 11/2007 | Guha et al. | |
| 2007/0295392 A1 | 12/2007 | Cinnamon | |
| 2007/0295393 A1 | 12/2007 | Cinnamon | |
| 2008/0000512 A1 * | 1/2008 | Flaherty et al. | 136/244 |
| 2008/0115822 A1 | 5/2008 | Cunningham et al. | |
| 2008/0190047 A1 | 8/2008 | Allen | |
| 2008/0289272 A1 * | 11/2008 | Flaherty et al. | 52/173.3 |
| 2008/0302031 A1 | 12/2008 | Bressler | |
| 2009/0000222 A1 * | 1/2009 | Kalkanoglu et al. | 52/173.3 |
| 2010/0146878 A1 * | 6/2010 | Koch et al. | 52/173.3 |
| 2011/0000535 A1 * | 1/2011 | Davidson | 136/256 |

FOREIGN PATENT DOCUMENTS

| | | |
|---|---|---|
| EP | 1744372 A2 | 1/2007 |
| EP | 1923920 A1 | 5/2008 |
| JP | 2143468 | 1/1990 |
| JP | 2216874 | 8/1990 |
| JP | 10189924 A | 7/1998 |
| WO | 2007/035677 A2 | 3/2007 |
| WO | 2009042492 | 9/2008 |
| WO | 2008/137966 A2 | 11/2008 |
| WO | 2008139102 | 11/2008 |
| WO | 2009042496 | 4/2009 |
| WO | 2009042522 | 4/2009 |
| WO | 2009042523 | 4/2009 |
| WO | 2011/122759 A2 | 9/2011 |

OTHER PUBLICATIONS

Dupont Hytrel Design Information, published by DuPont, Sep. 1998, retrieved online Oct. 27, 2012 from http://plastics.dupont.com/plastics/pdflit/europe/hytrel/HYTDGe.pdf.*

"Teflon FEP fluoropolymer resin," Doc. 220338D, published by DuPont, (1998) [retrieved from internet at http://www.rjchase.com/fep_handbook.pdf on Apr. 5, 2013].*

D. A. Willoughby, et al., "Plastic Piping Handbook," p. 2.4-2.11,5.3-5.6, McGraw-Hill (2002).*

"Schott Flat Glass—Delivery Specification", Nov. 12, 2008 [retrieved from internet at http://www.schott.com/flatglass/english/download/schott_flat_glass_delivery_specification_12nov2008.pdf on Sep. 11, 2013].*

"Saint-Gobain Performance Plastics Specialty and High-Performance Films", 2007 [retrieved from internet at http://www.oilandgas.saint-gobain.com/uploadedFiles/SGoilandgas/Documents/Films/HPFilms-Capabilities-AFF1181.pdf on Sep. 12, 2013].*

D. A. Willoughby, et al., "Plastic Piping Handbook", p. 2.14-2.16, McGraw-Hill (2002).*

Definition of "embed" [retrieved from internet at http://www.thefreedictionary.com/embed on Sep. 12, 2013].*

Written Opinion for related PCT Application PCT/US 2011/027802 mailed May 23, 2012, Publication No. WO 2011/112759.

Written Opinion for related PCT Application PCT/US 2011/027802 mailed Oct. 29, 2012, Publication No. WO 2011/112759.

International Preliminary Report of Patentability for related PCT Application PCT/US 2011/027802 mailed Jan. 17, 2013, Publication No. WO 2011/112759.

* cited by examiner

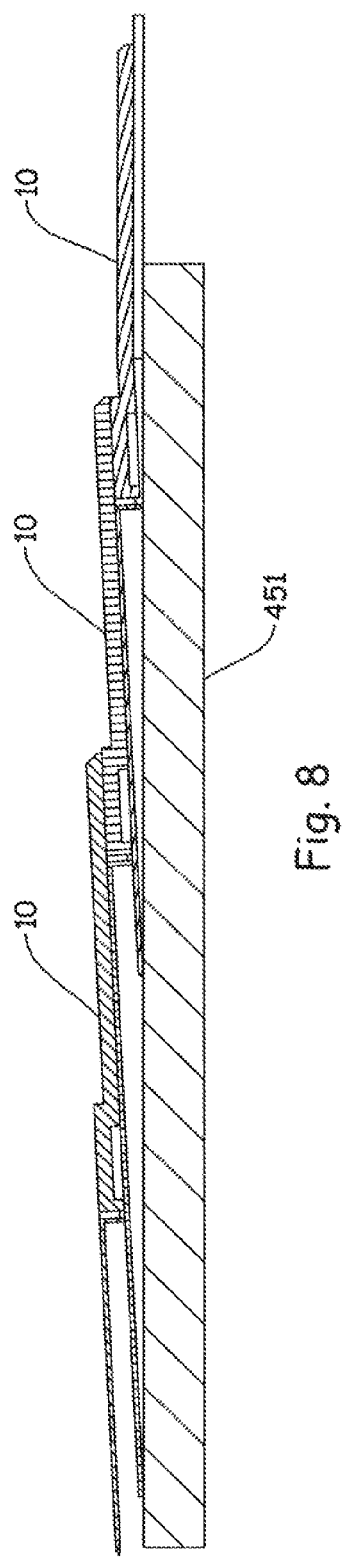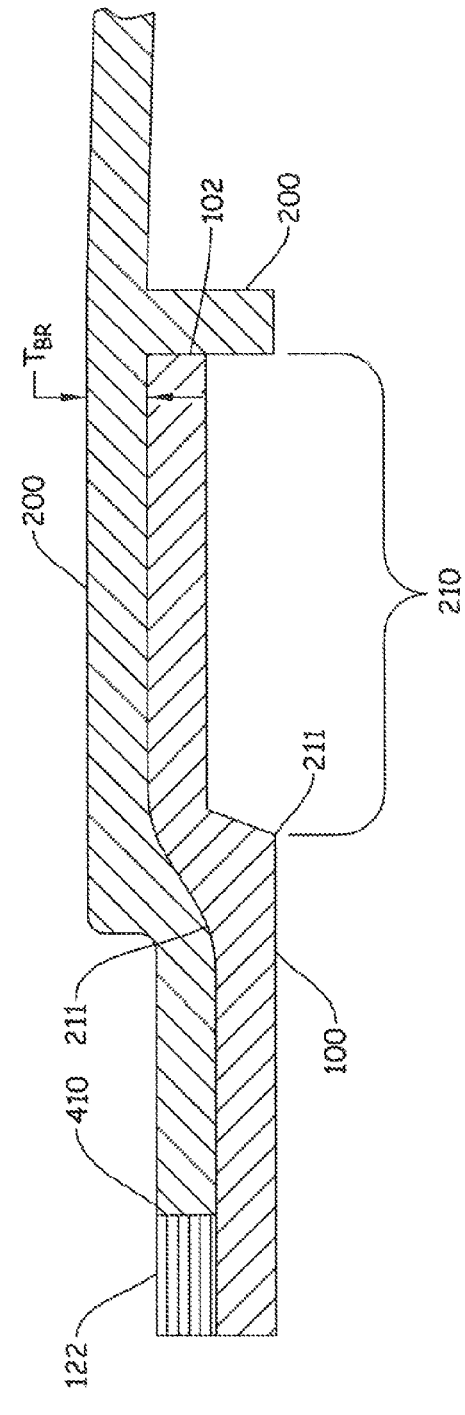

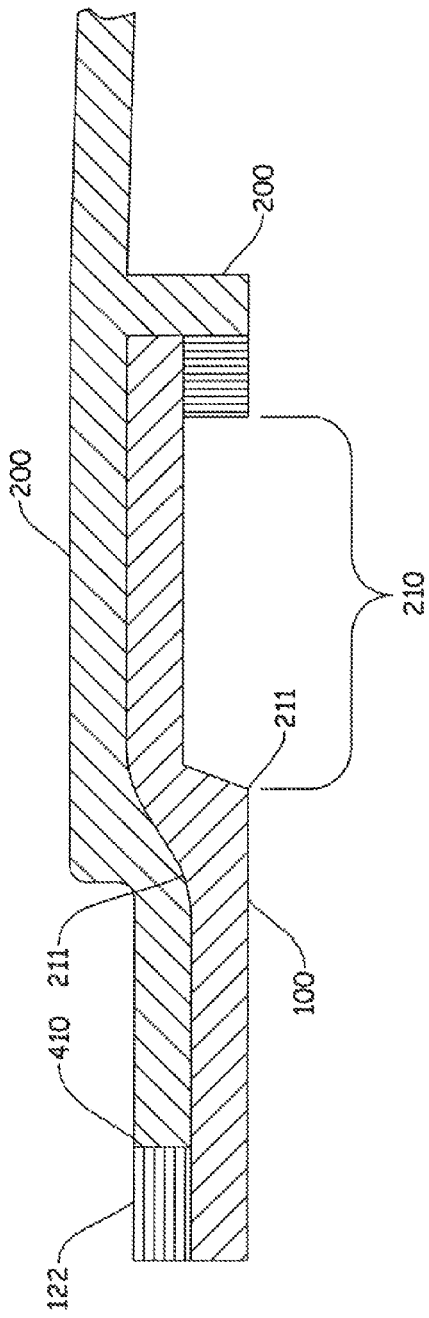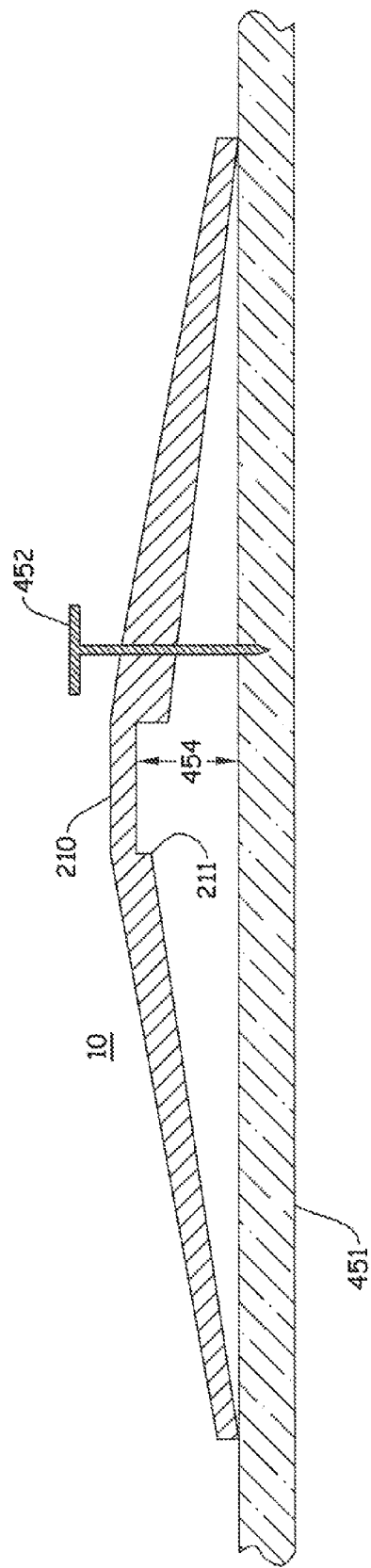

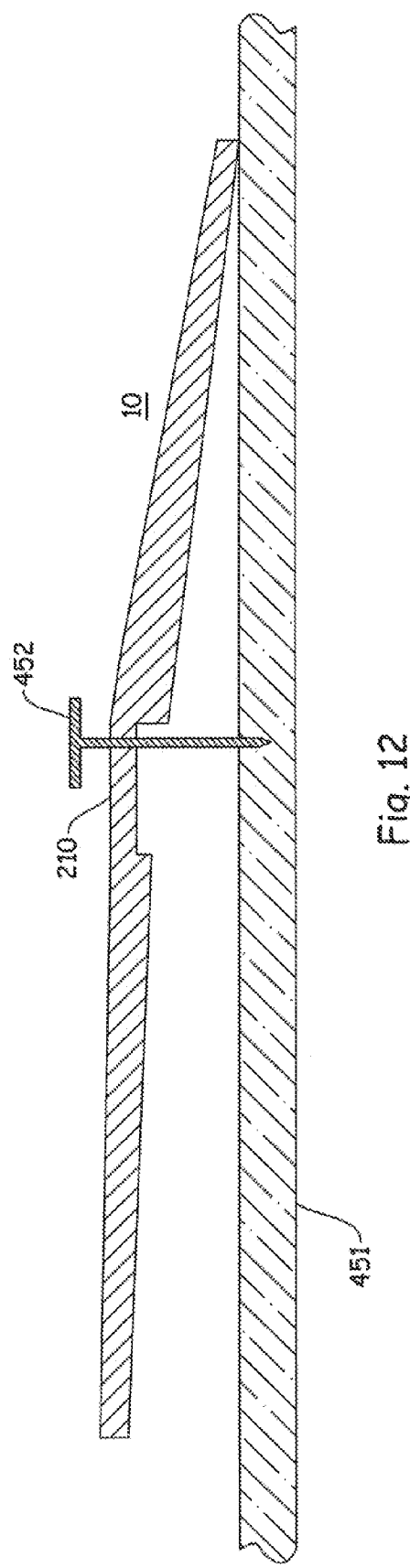

PHOTOVOLTAIC DEVICE

CLAIM OF PRIORITY

The present application claims the benefit of the filing date of U.S. Provisional Application No. 61/313,310, filed Mar. 12, 2010, the contents of which are hereby incorporated by reference in their entirety.

FIELD OF THE INVENTION

The present invention relates to an improved photovoltaic device ("PVD" or "PV device"), more particularly to an improved photovoltaic device with a multilayered photovoltaic cell assembly and a body portion joined at an interface region.

BACKGROUND

Efforts to improve PV devices, particularly those devices that are integrated into building structures (e.g. roofing shingles or exterior wall coverings), to be used successfully, should satisfy a number of criteria. The PV device should be durable (e.g. long lasting, sealed against moisture and other environmental conditions) and protected from mechanical abuse over the desired lifetime of the product, preferably at least 10 years, more preferably at least 25 years. The device should be easily installed (e.g. installation similar to conventional roofing shingles or exterior wall coverings) or replaced (e.g. if damaged). It may be desirable to choose materials and components, along with design features that aid in meeting the desired durability requirements such as being free of deformations that would impair performance (for example as published in United Laboratories UL 1703 Standard—ISBN 0-7629-0760-6 and or Temperature Cycling Test pursuant to IEC61646).

To make this full package desirable to the consumer, and to gain wide acceptance in the marketplace, the system should be inexpensive to build and install. This may help facilitate lower generated cost of energy, making PV technology more competitive relative to other means of generating electricity.

Existing art systems for PV devices may allow for the device to be directly mounted to the building structure or they may fasten the devices to battens, channels or "rails" ("stand-offs") above the building exterior (e.g. roof deck or exterior cladding). These systems may be complicated, typically do not install like conventional cladding materials (e.g. roofing shingles or siding) and, as a consequence, may be expensive to install. Also, they may not be visually appealing as they do not look like conventional building materials. "Stand-offs" to mount PV device every 2-4 feet may be required. Thus, installation cost can be as much or more as the cost of the article. They also may suffer from issues related to environmental conditions such as warping, fading and degradation of its physical properties.

Among the literature that can pertain to this technology include the following patent documents: US20080190047 (A1); U.S. Pat. Nos. 4,321,416; 5,575,861; 5,437,735; 5,990,414; 6,840,799; EP1744372; U.S. Pat. Nos. 6,875,914; 5,590,495; 5,986,203; US2008/0115822; EP1923920; U.S. Pat. No. 7,365,266; US20070295393 A1; US20070295392 A1; WO 2008/139102; WO 2009/042496; WO 2009/042492; WO 2009/042523; WO 2009/042522; and U.S. Provisional 61/233,527, all incorporated herein by reference for all purposes.

SUMMARY OF THE INVENTION

The present invention is directed to a PV device that addresses at least one or more of the issues described in the above paragraphs.

Accordingly, pursuant to one aspect of the present invention, there is contemplated a photovoltaic device including at least a multilayered photovoltaic cell assembly comprised of: at least a polygonal barrier layer with a barrier CLTE and a photovoltaic cell layer disposed inboard of a barrier layer peripheral edge, the barrier layer including a barrier lower surface portion, a barrier upper surface portion and a barrier side surface portion spanning between the upper and lower surface portions with a barrier profile between the upper and lower surface portions and a barrier perimeter spanning about the polygonal barrier layer which forms the barrier layer peripheral edge; a body portion comprised of: a body material with a body CLTE, the body portion with a body lower surface portion, body upper surface portion and a body side surface portion spanning between the upper and lower surface portions and forming a body peripheral edge, wherein at least a portion of the body portion abuts to a segment of the barrier layer peripheral edge at an interface region; wherein (A) the segment of the barrier layer peripheral edge that abuts the portion of the body portion has rounded barrier perimeter corners within the segment and/or (B) the device further includes at least one component of a connector assembly at least partially embedded in the body side surface portion and the connector assembly component includes a connector assembly lower surface portion, a connector assembly upper surface portion and a connector assembly side surface portion spanning between the upper and lower surface portions which forms a connector assembly peripheral edge, wherein the connector assembly peripheral edge that is closest to the interface region has at least one rounded connector corner, and the connector assembly is in electrical communication with the photovoltaic cell layer.

The invention may be further characterized by one or any combination of the features described herein, such as the at least one component of the connector assembly is disposed away from the interface region by a disposal distance (in mm) defined by greater than or equal to X*(body CLTE/barrier CLTE)+C, wherein X ranges from 1.0 to 4.0 and C ranges from 0.5 to 10.0; the at least one component of the connector assembly is disposed away from the interface region by a disposal distance calculated as a ratio (disposal distance/$L_{BP}$), wherein the ratio ranges between 0.02 to 0.1; the rounded barrier perimeter corners have a radius that is determined as a ratio of the $L_{BP}$, the $L_{BP}$ as measured within 25.0 mm of the rounded barrier perimeter corners, to the radius (radius/$L_{BP}$), wherein the ratio ranges from 0.000172 to 0.0259; the barrier layer comprises glass; the rounded barrier perimeter corners have a radius of at least 2.0 mm; the at least one rounded connector corner has a radius of at least 1.0 mm; the body material comprises a polypropylene containing up to 65% by weight of a filler; the body CLTE and the barrier CLTE is within 1.5 to 10 times one another; the body material has a modulus of greater than 0.3 GPa as measured at 25° C.; the filler comprises glass fibers; the interface region is free from cracks protruding through the body side surface portion after being subjected to a Temperature Cycling Test pursuant to IEC61646; the photovoltaic device includes a bending region that has a starting point away from the interface region by a distance defined by greater than or equal to a Constant X'*(body CLTE/barrier CLTE)+a Constant C', wherein X' ranges from 1.0 to 5.0 and C' ranges from 1.0 to 5.0.

Accordingly, pursuant to another aspect of the present invention, there is contemplated a photovoltaic device including at least a multilayered photovoltaic cell assembly comprised of: at least a polygonal barrier layer with a barrier CLTE and a photovoltaic cell layer disposed inboard of a barrier layer peripheral edge, the barrier layer including a barrier lower surface portion, a barrier upper surface portion and a barrier side surface portion spanning between the upper and lower surface portions with a barrier profile between the upper and lower surface portions and a barrier perimeter spanning about the polygonal barrier layer which forms the barrier layer peripheral edge; a body portion comprised of: a body material with a body CLTE, the body portion with a body lower surface portion, body upper surface portion and a body side surface portion spanning between the upper and lower surface portions and forming a body peripheral edge, wherein at least a portion of the body portion abuts to a segment of the barrier layer peripheral edge at an interface region; wherein the body portion includes a bending region that has a thickness ("$T_{BR}$") of about 2.5 mm to 4.0 mm, further wherein the bending region that has a starting point away from the interface region by a distance defined by greater than or equal to a Constant X'*(body CLTE/barrier CLTE)+a Constant C', wherein X' ranges from 1.0 to 5.0 and C' ranges from 1.0 to 5.0.

The invention may be further characterized by one or any combination of the features described herein, such as the thickness ("$T_{BR}$") is 0.3 to 1.9 times the ratio of a subassembly CLTE to the body CLTE (subassembly CLTE/body CLTE); the ratio ranges from 1.0 to 10.0; the bending region is located between the interface region and a fastening region; the photovoltaic device has a cupping value that ranges from 3.0 mm to 30.0 mm.

It should be appreciated that the above referenced aspects and examples are non-limiting, as others exist within the present invention, as shown and described herein.

DESCRIPTION OF THE DRAWINGS

FIG. 8 is a side view of several PV devices on a building structure.

FIG. 9 is a close sectional view of an illustrative bending region according to the present invention.

FIG. 10 is a close sectional view of another illustrative bending region according to the present invention.

FIG. 11 is a side view showing an illustrative desirable cant.

FIG. 12 is a side view showing an illustrative un-desirable cant.

DETAILED DESCRIPTION OF THE PREFERRED EMBODIMENT

Figure 1:
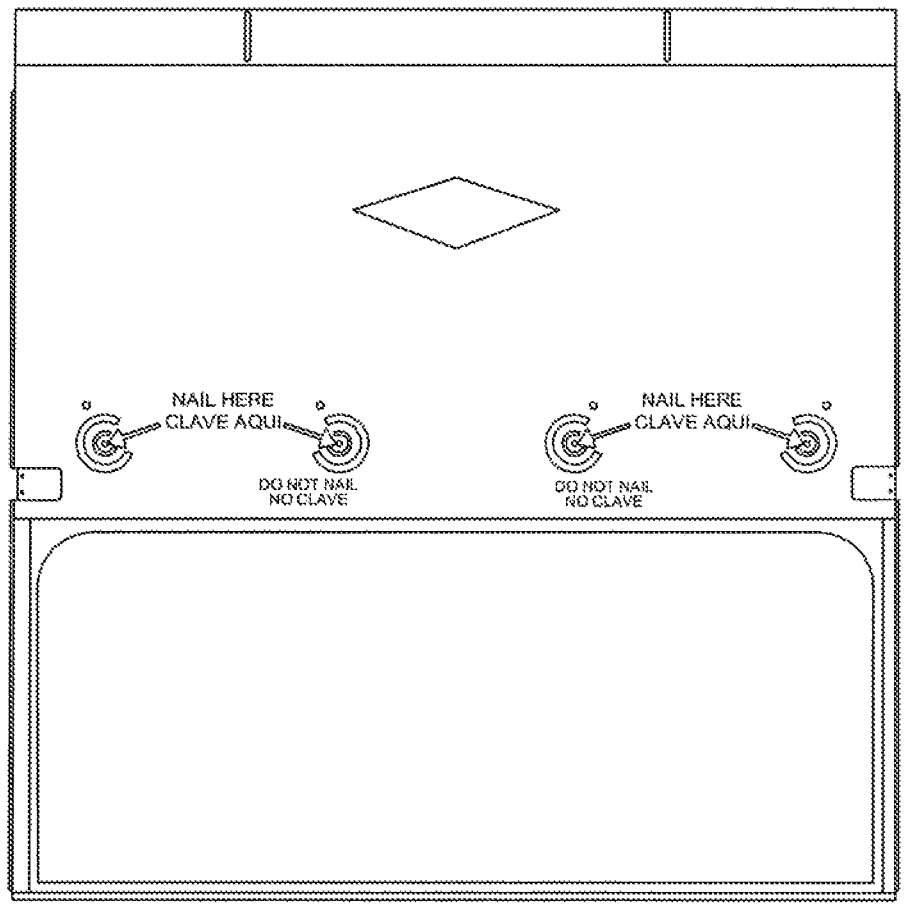
FIG. 1 is a plan view of an illustrative PV device according to the present invention.

The present invention relates to an improved photovoltaic device 10 (hereafter "PV device"), as illustrated in FIG. 1, can be described generally as an assembly of a number of components and component assemblies that functions to provide electrical energy when subjected to solar radiation (e.g. sunlight). Of particular interest and the main focus of the present disclosure is an improved PV device 10 that includes at least a multilayered photovoltaic cell assembly 100 (hereafter "MPCA") joined to a body portion 200. In a preferred embodiment, the PV device is formed by taking the MPCA (and potentially other components and assemblies such as connector components) and forming (e.g. via injection molding) the body portion about at least portions the MPCA. It is contemplated that the relationships (e.g. at least the geometric properties and the material properties) between the components and component assemblies are surprisingly important in solving one or more the issues discussed in the background section above. Of particular interest in this invention is where the PV device 10 is utilized for what is commonly known as Building-Integrated Photovoltaics, or BIPV. Each of the components and component assemblies and their relationships are disclosed in greater detail and specificity in the following paragraphs.

Multilayered Photovoltaic Cell Assembly (MPCA) 100

Figure 2A:
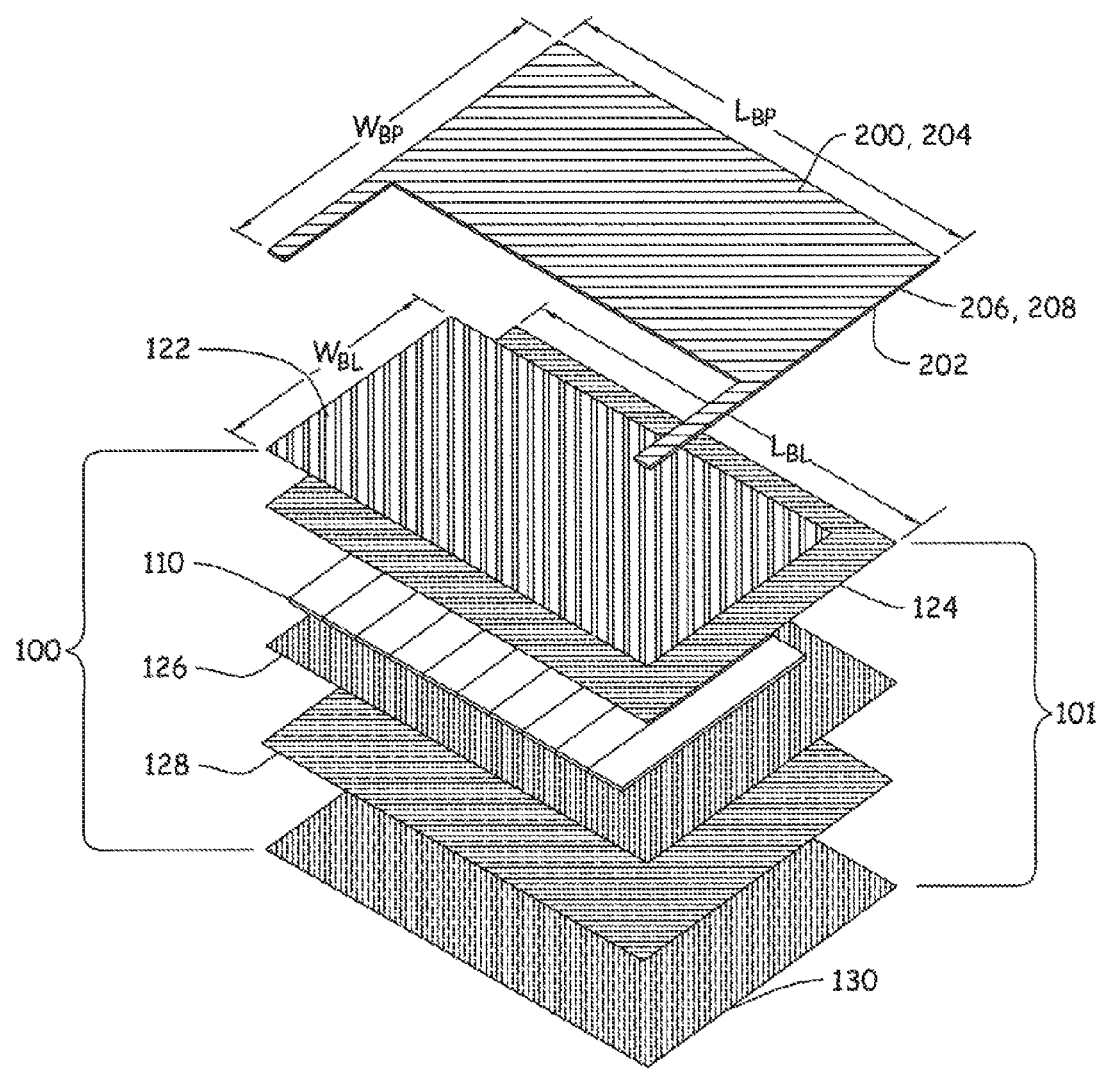
FIG. 2A is a perspective and exploded view of an illustrative PV device according to the present invention.
Figure 2B:
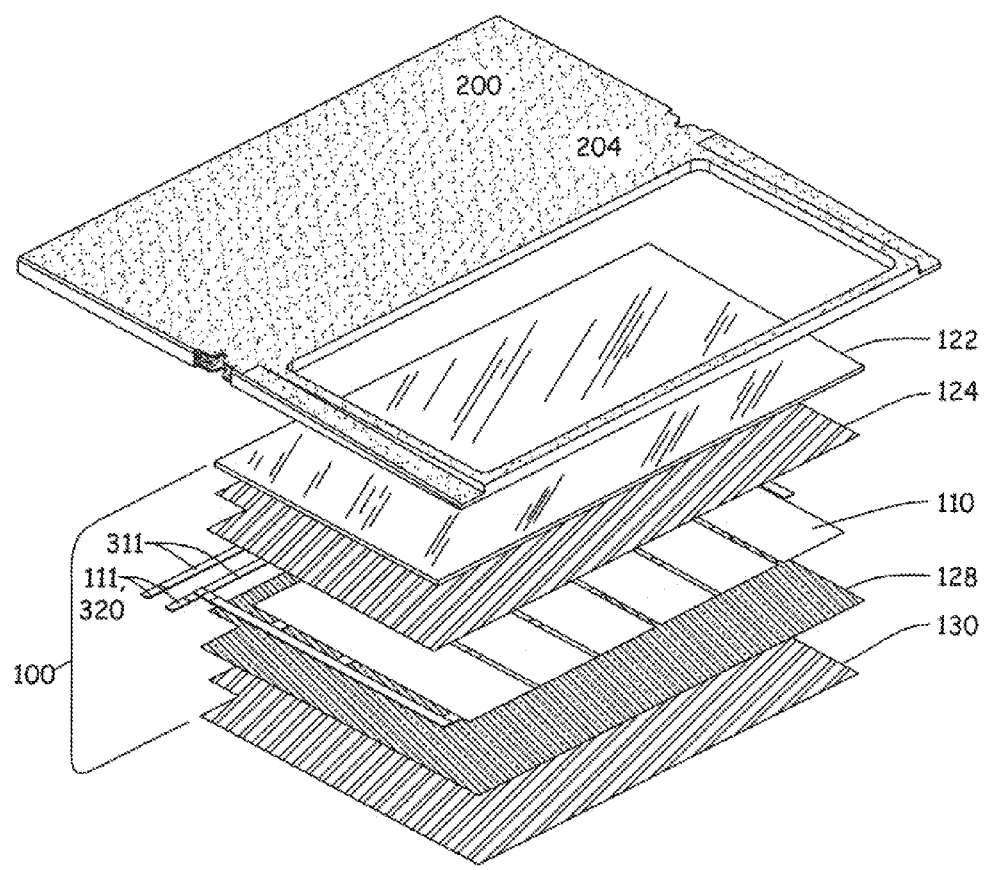
FIG. 2B is a perspective and exploded view of another illustrative PV device according to the present invention.

It is contemplated that the MPCA 100 may be a compilation of numerous layers and components/assemblies, for example as disclosed in currently pending International patent application No. PCT/US09/042,496, incorporated herein by reference. The MPCA contains at least a polygonal barrier layer 122 and a photovoltaic cell layer 110 (generally located inboard of the peripheral edge of the barrier layer 122). It is contemplated that the MPCA 100 may also contain other layer, such as encapsulant layers and other protective layers. Illustrative examples are shown in the figures and are discussed below. Exploded views of exemplary MPCAs 100 are shown in FIGS. 2A and 2B.

Functionally, these encapsulant layers and other protective layers may include a number of distinct layers that each serve to protect and/or connect the MCPA 100 together. Each preferred layer is described in further detail below, moving from the "top" (e.g. the layer most exposed to the elements) to the "bottom" (e.g. the layer most closely contacting the building or structure). In general each preferred layer or sheet may be a single layer or may itself comprise sub layers.

Polygonal Barrier Layer 122

The polygonal barrier layer 122 may function as an environmental shield for the MPCA 100 generally, and more particularly as an environmental shield for at least a portion of the photovoltaic cell layer 110. The polygonal barrier layer 122 is preferably constructed of a transparent or translucent material that allows light energy to pass through to the photoactive portion of the photovoltaic cell layer 110. This material may be flexible (e.g. a thin polymeric film, a multi-layer film, glass, or glass composite) or be rigid (e.g. a thick glass or Plexiglas such as polycarbonate). The material may also be characterized by being resistant to moisture/particle penetration or build up. The polygonal barrier layer 122 may also function to filter certain wavelengths of light such that preferred wavelengths may readily reach the photovoltaic cells. In a preferred embodiment, the polygonal barrier layer 122 material will also range in thickness from about 0.05 mm to 10.0 mm, more preferably from about 0.1 mm to 4.0 mm, and most preferably from 2.5 to 3.5. Other physical characteristics, at least in the case of a film, may include: a tensile strength of greater than 20 MPa (as measured by JIS K7127); tensile elongation of 1% or greater (as measured by JIS K7127); and/or a water absorption (23° C., 24 hours) of 0.05% or less (as measured per ASTM D570); and/or a coefficient of linear expansion ("CLTE") of about 5×10−6 mm/mm ° C. to 100×10−6 mm/mm ° C., more preferably of about 10×10−6 mm/mm ° C. to 80×10$^{-6}$ mm/mm ° C., and most preferably from about 20×10−6 mm/mm ° C. to 50×10−6 mm/mm ° C. Other physical characteristics, at least in the case of a thick glass, may include: a coefficient of linear expansion ("CLTE") of about 0.5×10−6 mm/mm ° C. to about 140×10−6 mm/mm ° C., preferably of about 3×10−6 mm/mm ° C. to about 50×10−6 mm/mm ° C., more preferably from about 5×10−6 mm/mm ° C. to about 30×10−6 mm/mm ° C., and most preferably from about 7×10−6 mm/mm ° C. to about 15×10−6 mm/mm ° C. Other physical characteristics, at least in the case of a thick glass, may include: a density of about 2.42 g/cm$^3$ to about 2.52 g/cm$^3$, a tensile strength of between about 120 to 200 N/sq. mm, a compressive strength of between 800 and 1200 N/sq. mm, a modulus of elasticity of between 60-80 Gpa, a CLTE of about 9×10−6 mm/mm ° C., and a visible light transmission of at least about 85%, preferably about at least 87%, more preferably at least about 90%.

Figure 3:
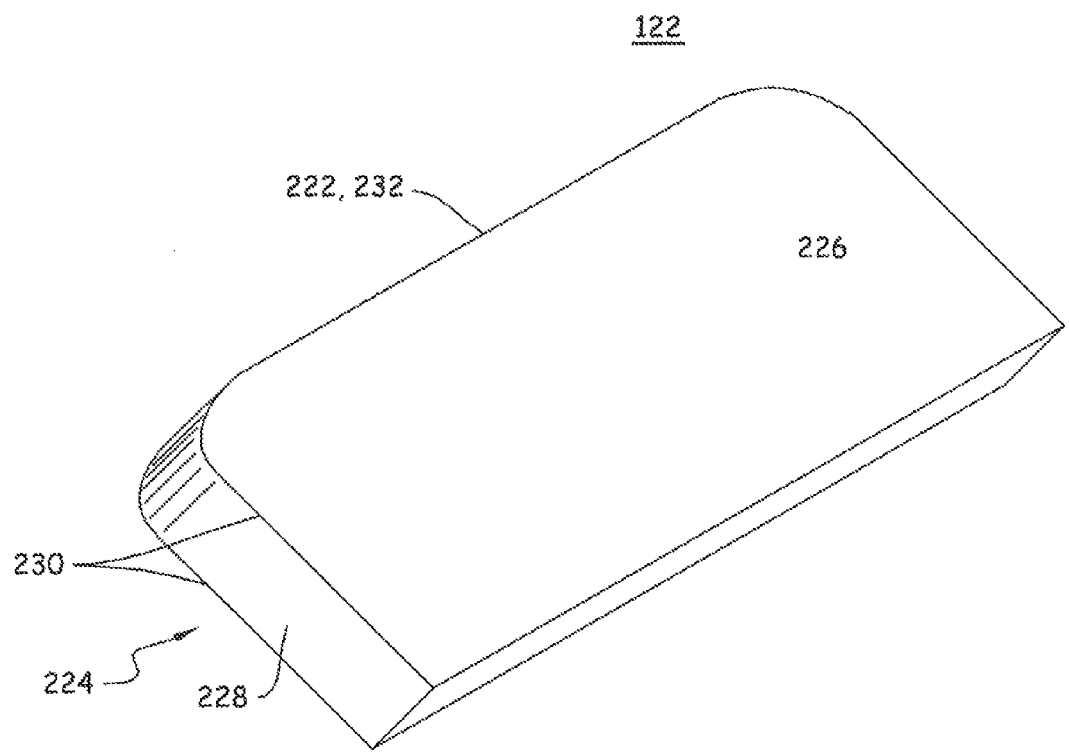
FIG. 3 is a perspective view of an illustrative barrier layer according to the present invention.

The polygonal barrier layer 122, as shown in FIG. 3, may also be further described as including a barrier layer peripheral edge 222, a barrier lower surface portion 224, a barrier upper surface portion 226 and a barrier side surface portion 228 spanning between the upper and lower surface portions 226,224. The barrier side surface 228 being defined as having a barrier profile 230 between the upper and lower surface portions and a barrier perimeter 232 spanning about the polygonal barrier layer 122 (which forms the barrier layer peripheral edge 222).

First Encapsulant Layer 124

In one example of an encapsulant layer, a first encapsulant layer 124 may be disposed below the polygonal barrier layer 122 and generally above the photovoltaic cell layer 110. It is contemplated that the first encapsulant layer 124 may serve as a bonding mechanism, helping hold the adjacent layers together. It should also allow the transmission of a desirous amount and type of light energy to reach the photovoltaic cell 110. The first encapsulant layer 124 may also function to compensate for irregularities in geometry of the adjoining layers or translated though those layers (e.g. thickness changes). It also may serve to allow flexure and movement between layers due to temperature change and physical movement and bending. In a preferred embodiment, first encapsulant layer 124 may consist essentially of an adhesive film or mesh, preferably an EVA (ethylene-vinyl-acetate), thermoplastic polyolefin or similar material. The preferred thickness of this layer ranges from about 0.1 mm to 1.0 mm, more preferably from about 0.2 mm to 0.8 mm, and most preferably from about 0.25 mm to 0.5 mm.

Photovoltaic Cell Layer 110

The photovoltaic cell layer 110 contemplated in the present invention may be constructed of any number of known photovoltaic cells commercially available or may be selected from some future developed photovoltaic cells. These cells function to translate light energy into electricity. The photoactive portion of the photovoltaic cell is the material which converts light energy to electrical energy. Any material known to provide that function may be used including crystalline silicon, amorphous silicon, CdTe, GaAs, dye-sensitized solar cells (so-called Gratezel cells), organic/polymer solar cells, or any other material that converts sunlight into electricity via the photoelectric effect. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula CuIn(1-x)GaxSe(2-y)Sy where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. These cells may be flexible or rigid and come in a variety of shapes and sizes, but generally are fragile and subject to environmental degradation. In a preferred embodiment, the photovoltaic cell assembly 110 is a cell that can bend without substantial cracking and/or without significant loss of functionality. Exemplary photovoltaic cells are taught and described in a number of US patents and publications, including U.S. Pat. Nos. 3,767,471, 4,465,575, US20050011550 A1, EP841706 A2, US20070256734 a1, EP1032051A2, JP2216874, JP2143468, and JP10189924a, incorporated hereto by reference for all purposes.

The photovoltaic cell layer 110, for example as illustrated in FIG. 2B, may also include electrical circuitry, such as buss bar(s) 111 that are electrically connected to the cells, the connector assembly component(s) 300 and generally run from side to side of the PV device 10. This area may be known as the buss bar region 311.

Second Encapsulant Layer 126

In another example of an encapsulant layer, a second encapsulant layer 126, is generally connectively located below the photovoltaic cell layer 110, although in some instances, it may directly contact the top layer 122 and/or the first encapsulant layer 124. It is contemplated that the second encapsulant layer 126 may serve a similar function as the first encapsulant layer, although it does not necessarily need to transmit electromagnetic radiation or light energy.

Back Sheet 128

In an example of a protective layer there may be a back sheet 128 which is connectively located below the second encapsulant layer 126. The back sheet 128 may serve as ari environmental protection layer (e.g. to keep out moisture and/or particulate matter from the layers above). It is preferably constructed of a flexible material (e.g. a thin polymeric film, a metal foil, a multi-layer film, or a rubber sheet). In a preferred embodiment, the back sheet 128 material may be moisture impermeable and also range in thickness from about 0.05 mm to 10.0 mm, more preferably from about 0.1 mm to 4.0 mm, and most preferably from about 0.2 mm to 0.8 mm. Other physical characteristics may include: elongation at break of about 20% or greater (as measured by ASTM D882); tensile strength or about 25 MPa or greater (as measured by ASTM D882); and tear strength of about 70 kN/m or greater (as measured with the Graves Method). Examples of preferred materials include glass plate, aluminum foil, Tedlar® (a trademark of DuPont) or a combination thereof.

Supplemental Barrier Sheet 130

In another example of a protective layer there may be a supplemental barrier sheet 130 which is connectively located below the back sheet 128. The supplemental barrier sheet 130 may act as a barrier, protecting the layers above from environmental conditions and from physical damage that may be caused by any features of the structure on which the PV device 10 is subjected to (e.g. For example, irregularities in a roof deck, protruding objects or the like). It is contemplated that this is an optional layer and may not be required. It is also contemplated that this layer may serve the same functions as the body portion 200. In a preferred embodiment, the supplemental barrier sheet 130 material may be at least partially moisture impermeable and also range in thickness from about 0.25 mm to 10.0 mm, more preferably from about 0.5 mm to 2.0 mm, and most preferably from 0.8 mm to 1.2 mm. It is preferred that this layer exhibit elongation at break of about 20% or greater (as measured by ASTM D882); tensile strength or about 10 MPa or greater (as measured by ASTM D882); and tear strength of about 35 kN/m or greater (as measured with the Graves Method). Examples of preferred materials include thermoplastic polyolefin ("TPO"), thermoplastic elastomer, olefin block copolymers ("OBC"), natural rubbers, synthetic rubbers, polyvinyl chloride, and other elastomeric and plastomeric materials. Alternately the protective layer could be comprised of more rigid materials so as to provide additional roofing function under structural and environmental (e.g. wind) loadings. Additional rigidity may also be desirable so as to improve the coefficient of thermal expansion of the PV device 10 and maintain the desired dimensions during temperature fluctuations. Examples of protective layer materials for structural properties include polymeric materials such polyolefins, polyester amides, polysulfone, acetal, acrylic, polyvinyl chloride, nylon, polycarbonate, phenolic, polyetheretherketone, polyethylene terephthalate, epoxies, including glass and mineral filled composites or any combination thereof.

The above described layers may be configured or stacked in a number of combinations, but it is preferred that the polygonal barrier layer 122 is the top layer. Additionally, it is contemplated that these layers may be integrally joined together via any number of methods, including but not limited to: adhesive joining; heat or vibration welding; over-molding; or mechanical fasteners.

For the sake of clarity in view of some of the embodiments discussed below, the MPCA 100 can be further described in another fashion, as a two part assembly. The first part, the MPCA subassembly 101, comprising all the layers of the MPCA 100 (with the exception of the polygonal barrier layer 122) and the second part being the polygonal barrier layer 122. The barrier layer 122 may also be described as having a length "$L_{BL}$" and a width "$W_{BL}$", for example as labeled in FIG. 2A. Preferably, the $L_{BL}$ ranges from about 0.75 to about 1.25 times that of the $L_{BP}$ discussed below, more preferably the lengths are within about 5-10% of each other. Also contemplated is that the MPCA subassembly 101 may have an overall CLTE ("subassembly CLTE") that ranges from about 30×10-6 mm/mm ° C. to 150×10-6 mm/mm ° C., more preferably about 50×10-6 mm/mm ° C. to 100×10-6 mm/mm ° C.

Body Portion 200

It is contemplated that the body portion 200 may be a compilation of components/assemblies, but is preferably generally a polymeric article that is formed by injecting a polymer (or polymer blend) into a mold (with or without inserts such as the MPCA 100 or the other component(s) (e.g. connector component)—discussed later in the application), for example as disclosed in currently pending International patent application No. PCT/US09/042,496, incorporated herein by reference. The body portion 200 functions as the main structural carrier for the PV device 10 and should be constructed in a manner consistent with this. For example, it can essentially function as a plastic framing material.

It is contemplated that the compositions that make up the body portion 200 also exhibit a coefficient of linear expansion ("CLTE") of about 0.5×10-6 mm/mm ° C. to about 140×10-6 mm/mm ° C., preferably of about 3×10-6 mm/mm ° C. to about 50×10-6 mm/mm ° C., more preferably from about 5×10-6 mm/mm ° C. to about 30×10-6 mm/mm ° C., and most preferably from about 7×10-6 mm/mm ° C. to about 15×10-6 mm/mm ° C. Most desirably, the CLTE of the composition that makes up the body portion 200 should closely match the CLTE of the polygonal barrier layer 122. Preferably the CLTE of the composition making up the body portion 200 disclosed herein is also characterized by a coefficient of linear thermal expansion (CLTE) which is within a factor of 20, more preferably within a factor of 15, still more preferably within a factor of 10, even more preferably within a factor of 5, and most preferably within a factor of 2 of the CLTE of the polygonal barrier layer 122. For example, if the polygonal barrier layer 122 has a CLTE of 9×10-6 mm/mm ° C., then the CLTE of the molding composition is preferably between 180×10-6 mm/mm ° C. and 0.45×10-6 mm/mm ° C. (a factor of 20); more preferably between 135×10-6 mm/mm ° C. and 0.6×10-6 mm/mm ° C. (a factor of 15); still more preferably between 90×10-6 mm/mm ° C. and 0.9×10-6 mm/mm ° C. (a factor of 10); even more preferably between 45×10-6 mm/mm ° C. and 1.8×10-6 mm/mm ° C. (a factor of 5) and most preferably between 18×10-6 mm/mm ° C. and 4.5×10-6 mm/mm ° C. (a factor of 2). Matching the CLTE's between the composition comprising the body portion 200 and the polygonal barrier layer 122 is important for minimizing thermally-induced stresses on the BIPV device during temperature changes, which can potentially result in cracking, breaking of PV cells, etc.

For some embodiments of the photovoltaic articles disclosed herein, the polygonal barrier layer 122 includes a glass barrier layer. If the polygonal barrier layer 122 includes a glass layer, the CLTE of the molding composition is preferably less than 80×10-6 mm/mm ° C., more preferably less than 70×10-6 mm/mm ° C., still more preferably less than 50×10-6 mm/mm ° C., and most preferably less than 30×10-6 mm/mm ° C. Preferably, the CLTE of the novel composition is greater than 5×10-6 mm/mm ° C.

In a preferred embodiment, the body support portion 200 may comprise (be substantially constructed from) a body material. This body material may be a filled or unfilled moldable plastic (e.g. polyolefins, acrylonitrile butadiene styrene (SAN), hydrogenated styrene butadiene rubbers, polyester amides, polyether imide, polysulfone, acetal, acrylic, polyvinyl chloride, nylon, polyethylene terephthalate, polycarbonate, thermoplastic and thermoset polyurethanes, synthetic and natural rubbers, epoxies, SAN, Acrylic, polystyrene, or any combination thereof). Fillers (preferably up to about 50% by weight) may include one or more of the following: colorants, fire retardant (FR) or ignition resistant (IR) materials, reinforcing materials, such as glass or mineral fibers, surface modifiers. Plastic may also include anti-oxidants, release agents, blowing agents, and other common plastic additives. In a preferred embodiment, glass fiber filler is used. The glass fiber preferably has a fiber length (after molding) ranging from about 0.1 mm to about 2.5 mm with an average glass length ranging from about 0.7 mm to 1.2 mm.

In a preferred embodiment, the body material (composition(s)) has a melt flow rate of at least 5 g/10 minutes, more preferably at least 10 g/10 minutes. The melt flow rate is preferably less than 100 g/10 minutes, more preferably less than 50 g/10 minutes and most preferably less than 30 g/10 minutes. The melt flow rate of compositions were determined by test method ASTM D1238-04, "REV C Standard Test Method for Melt Flow Rates of Thermoplastics by Extrusion Plastometer", 2004 Condition L (230° C./2.16 Kg). Polypropylene resins used in this application also use this same test method and condition. The melt flow rate of polyethylene and ethylene—α-olefin copolymers in this invention are measured using Condition E (190° C./2.16 Kg), commonly referred to as the melt index.

In all embodiments, the compositions have flexural modulus of at least 500 MPa, more preferably at least 600 MPa and most preferably at least 700 MPa. According to the preferred embodiment where the MPCA 100 includes a glass layer, the flexural modulus is preferably at least 1000 and no greater than 7000 MPa. According to the second embodiment, the flexural modulus is no greater than 1500 MPa, more preferably no greater than 1200 MPa, most preferably no greater than 1000 MPa. The flexural modulus of compositions were determined by test method ASTM D790-07 (2007) using a test speed of 2 mm/min. It is contemplated that the compositions that make up the body portion 200 also exhibit a coefficient of linear expansion ("body CLTE") of about $25 \times 10-6$ mm/mm ° C. to $70 \times 10-6$ mm/mm ° C., more preferably of about $27 \times 10-6$ mm/mm ° C. to $60 \times 10-6$ mm/mm ° C., and most preferably from about $30 \times 10-6$ mm/mm ° C. to $40 \times 10-6$ mm/mm ° C.

The compositions useful herein are characterized as having both an RTI Electrical and an RTI Mechanical Strength rating, each of which is at least 85° C., preferably at least 90° C., more preferably at least 95° C., still more preferably at least 100° C., and most preferably at least 105° C. Preferably, the novel compositions are characterized as having an RTI Electrical and an RTI Mechanical Strength, each of which is at least 85° C., preferably at least 90° C., more preferably at least 95° C., still more preferably at least 100° C., and most preferably at least 105° C. Most preferably, these compositions are characterized as having an RTI Electrical, an RTI Mechanical Strength, and an RTI Mechanical Impact rating, each of which is at least 85° C., preferably at least 90° C., more preferably at least 95° C., still more preferably at least 100° C., and most preferably at least 105° C.

RTI (Relative Thermal Index) is determined by the test procedure detailed in UL 746B (Nov. 29, 2000). Essentially a key characteristic of the plastic is measured at the start of the test (for instance tensile strength), and then samples placed in at least four elevated temperatures (e.g. 130, 140, 150, 160 deg C.) and samples periodically tested throughout several months. The reductions in key properties are then tested, and working criteria established from comparison results of known materials of proven field service. The effective lifetime of the unknown sample is then determined compared to the known material. RTI is expressed in degrees C. The test takes a minimum of 5000 hours to complete, and can be both time-consuming and costly.

Because RTI is an expensive and time-consuming test, a useful proxy for guiding the skilled artisan in selecting useful compositions is the melting point, as determined by differential scanning calorimetry (DSC). It is preferred that for the compositions set forth as useful herein, no melting point is seen at temperatures less than 160° C. in differential scanning calorimetry for a significant portion of the composition and preferably no melting point is seen under 160° C. for the entire composition. The Differential Scanning calorimetry profiles were determined by test method ASTM D7426-08 (2008) with a heating rate of 10° C./min. If a significant fraction of the injection molding composition melts at temperatures below 160° C., it is unlikely that the composition will pass the UL RTI tests 746B for Electrical, Mechanical Strength, Flammability, and Mechanical Impact with a high enough rating to adequately function when used in the PV device 10 (particularly when uses as a BIPV).

It is contemplated that the body portion 200 may be any number of shapes and sizes. For example, it may be square, rectangular, triangular, oval, circular or any combination thereof. The body portion 200 may also be described as having a length "$L_{BP}$" and a width "$W_{BP}$", for example as labeled in FIG. 2A and may be as little as 10 cm and as much as 100 cm or more, respectively. It may also have a thickness (T) that may range from as little as about 5 mm to as much as 20 mm or more and may vary in different area of the body portion 200. Preferably, the body portion 200 can be described, as having a body lower surface portion 202, body upper surface portion 204 and a body side surface portion 206 spanning between the upper and lower surface portions and forming a body peripheral edge 208.

Connector Assembly

Figure 5:
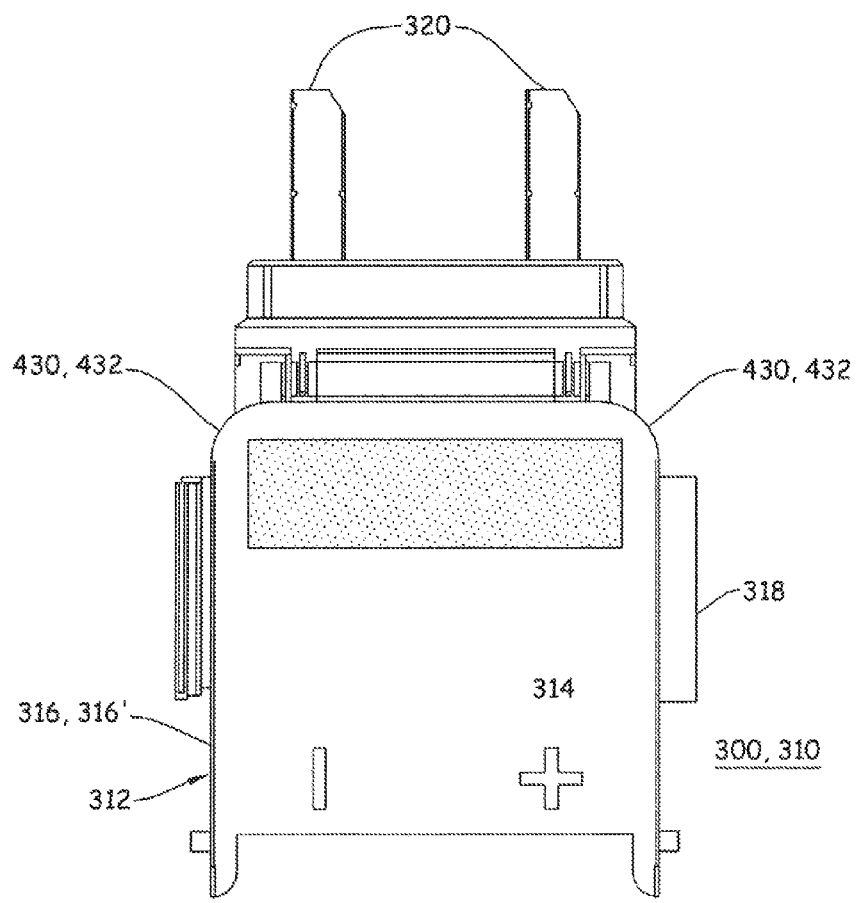
FIG. 5 is a plan view of an illustrative connector housing according to the present invention.

The connector assembly functions to allow for electrical communication to and/or from the PV device 10. This communication may be in conjunction with circuitry connected to the photovoltaic cell layer 110 or may just facilitate communication through and across the PV device 10 via other circuitry. The connector assembly may be constructed of various components and assemblies, and the main focus of this invention relates to the connector assembly component(s) 300 that are integral to (embedded within) the PV device. Generally, as illustrated in FIG. 5, this component 300 comprises a polymeric housing 310 and electrical leads 320 protruding into the PV device 10, although other configurations are contemplated. Examples of preferred materials that make up the housing 310 include: Polymeric compounds or blends of PBT (Polybutylene Terephthalate), PPO (Polypropylene Oxide), PPE (Polyphenylene ether), PPS (Polyphenylene sulfide), PA (Poly Amid) and PEI (polyether imide) and these can be with or without fillers of up to 65% by weight. It is contemplated that the compositions that make up the housing 310 also exhibit a coefficient of linear expansion ("CLTE") of about $20 \times 10-6$ mm/mm ° C. to $100 \times 10-6$ mm/mm ° C., more preferably of about $30 \times 10-6$ mm/mm ° C. to $80 \times 10-6$ mm/mm ° C., and most preferably from about $40 \times 10-6$ mm/mm ° C. to $60 \times 10-6$ mm/mm ° C.

In this illustrative connector housing 310, the housing may be further defined as having a connector assembly lower surface portion 312, a connector assembly upper surface portion 314 and a connector assembly side surface portion, 316 that spans between the upper and lower surface portions. The side surface portion 316 forming a connector assembly peripheral edge 316'. Also located on the side surface portion 316 may be flanges or projections 318.

It is also contemplated that the "connector assembly" or "connector housing 310" described above could be some other component or object that is located in the same place in the PV device 10. The relationships discussed in the following sections also apply to this other component or object.

Geometric and Material Property Relationships

It is believed that the choices of materials used in the construction of the PV device 10 and its constituent components and both the geometric and physical property relationships have an effect on overall performance of the system (e.g. durability and ease of assembly of multiple PV devices together). Balancing the needs of ease of manufacture, costs and/or product performance requirements may drive unique material choices and component design. The present invention contemplates these factors and provides a unique solution to achieve a desired result.

It is contemplated that it may be desirous to match physical properties as much as feasible of the various components such that the complete system can work in harmony (e.g. all or most components constructed from similar materials or material families). Where this cannot be achieved fully, it is contemplated that unique geometric design features may be needed. Of particular interest is the relationship of choice of material properties of the body portion 200, the polygonal barrier layer 122 and the geometric relationship to each other.

Also, it is contemplated that when a connector housing 310 is present, those relationships are in conjunction with it as well.

Barrier, Body and Connector Relationships

This section concentrates on certain aspects of the relationships between the barrier layer 122, the body portion 200, and/or the connector housing 310. Several illustrative examples and preferred embodiments are detailed herein. One skilled in the art should realize that these examples should not be limiting and the present invention contemplates other potential configurations.

Figure 4:
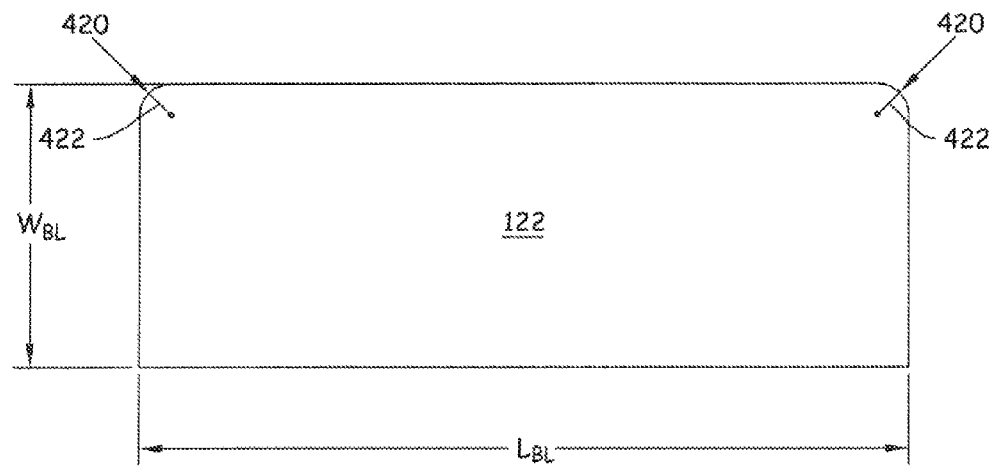
FIG. 4 is a plan view of FIG. 3.
Figure 6:
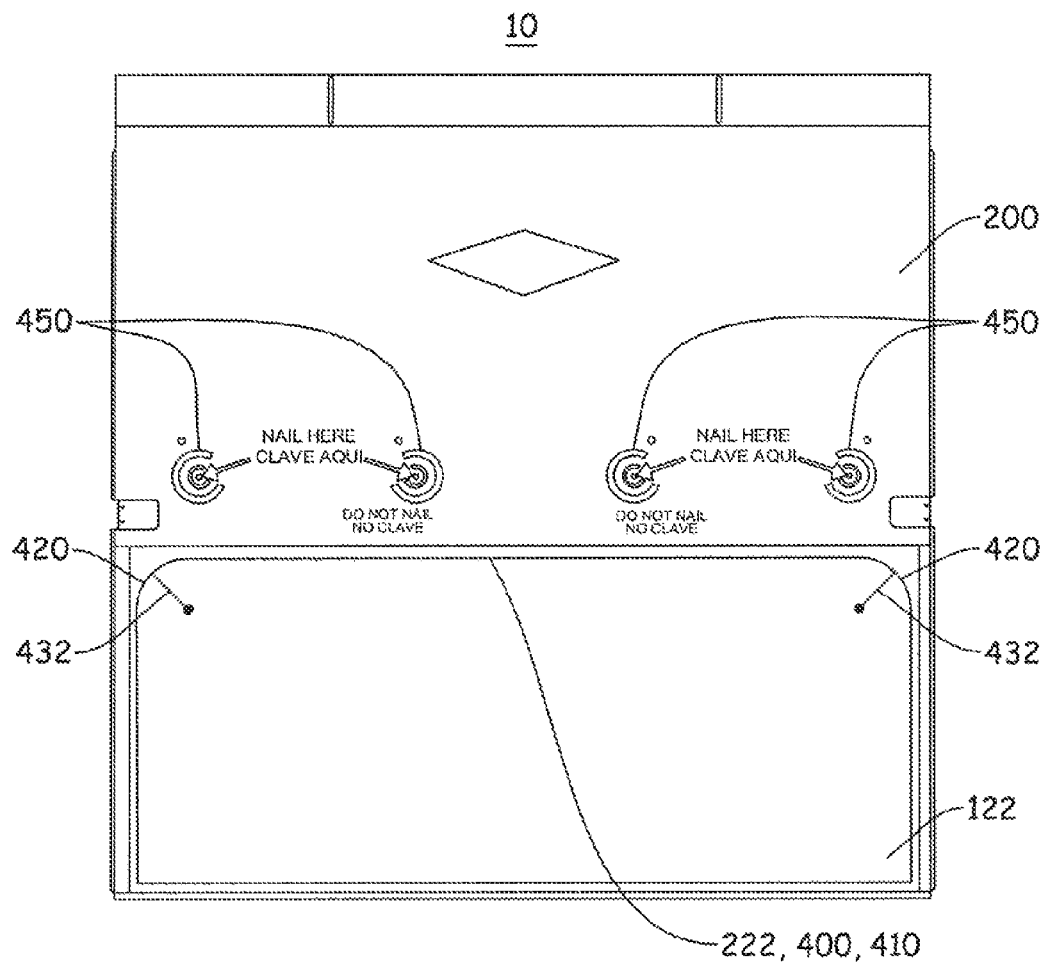
FIG. 6 is a plan view of another illustrative PV device according to the present invention.

In a first illustrative example, shown in FIGS. 3, 4 and 6, the body portion 200 and a portion of the barrier layer 122 are joined (e.g. are in contact) along a segment 400 of the barrier layer peripheral edge 222 (a segment 400 of the perimeter of the barrier's edge). This area where the two parts come together may be known as the interface region 410. It is contemplated that this interface may span across the entire barrier profile 230 or only a portion thereof or onto a portion of the barrier lower surface portion 224, the barrier upper surface portion 226, or both. In this example, the barrier layer is comprised of a glass with physical properties for the glass, as disclosed in previous sections of the specification. In this example, the barrier layer peripheral edge 222 has rounded barrier perimeter corners 420 within the segment 400. It is contemplated that the $L_{BL}$ may be equivalent to the $L_{BP}$ and that barrier layer peripheral edge 222 need not have rounded barrier perimeter corners 420 within the segment 400.

In a first preferred embodiment, these rounded corners 420 are located at least in the area of the segment 400 that faces the largest portion of the body portion 200, which can be clearly seen in the figures. Preferably, the rounded barrier perimeter corners 420 have a radius 422 of about 2.0 to 50.0 mm, more preferably about 12.5 mm to 30.0 mm, and most preferably about 17.0 to 27.0 mm.

In a second preferred embodiment, the radius 422 of the rounded barrier perimeter corners 420 is determined as a ratio of the $L_{BL}$ (at least as measured within about 25.0 mm of the interface region 410) to the $L_{BP}$, calculated as ($L_{BL}/L_{BP}$). Preferably, the ratio is about 0.00345 to 0.0862, more preferably about 0.01000 to 0.0500, and most preferably about 0.0400 to 0.0450.

When glass is used (as the barrier layer 122) as in this example, the compositions of the body material preferably have an elongation at break of at least 3% but not typically more than 50%. It is also contemplated, when glass is not used, that the body material preferably has an elongation at break of at least 100%, more preferably at least 200%, more preferably still at least 300% and preferably no more than 500%. The tensile elongation at break of compositions were determined by test method ASTM D638-08 (2008)@23° C. using a test speed of 50 mm/min.

Figure 7:
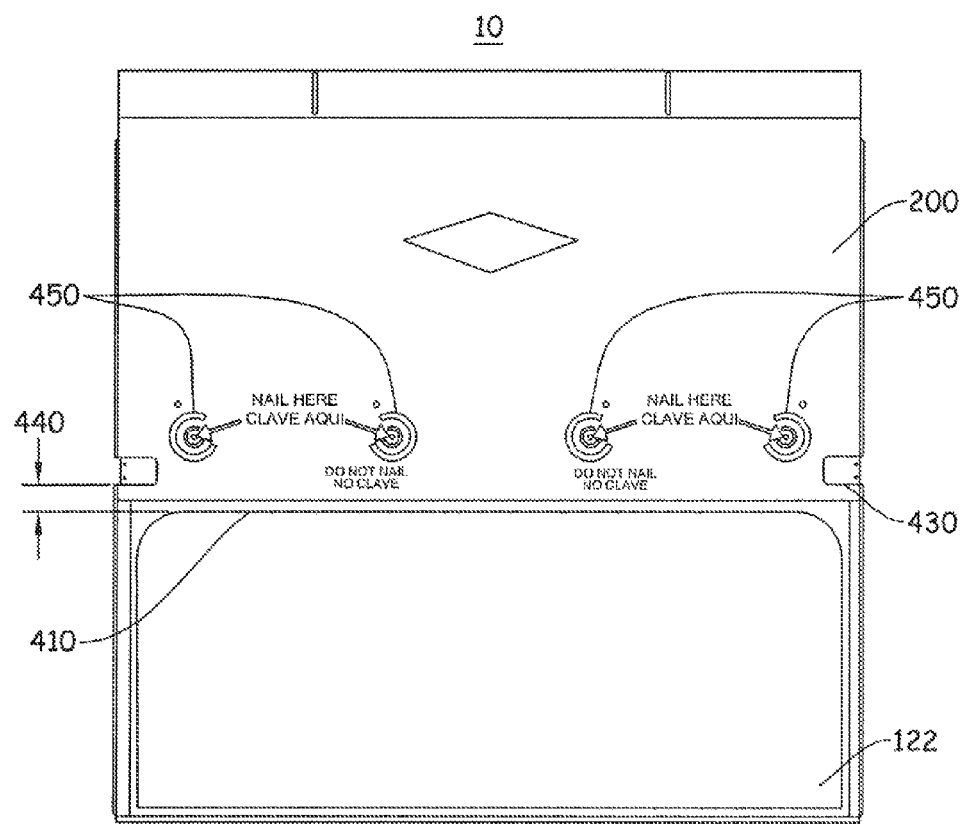
FIG. 7 is a plan view of another illustrative PV device according to the present invention.

In a second illustrative example, shown in FIGS. 5 and 7, the body portion 200 and the barrier layer 122 geometric relationships are maintained. In this example a connector housing 310 is present. It is contemplated and preferred that the connector assembly peripheral edge that is closest to the interface region has at least one rounded connector corner 430 with a radius 432. Generally, the rounded connector corner 430 may have a radius 432 of about 0.1 mm to 15.0 mm, more preferably about 0.5 mm to 5.0 mm, and most preferably about 1.0 mm to 4.0 mm. In this example, the at least one component of the connector assembly (e.g. connector housing 310) is disposed away from the interface region by a disposal distance 440 (e.g. closest point therebetween).

In a first preferred embodiment, a desirous disposal distance 440 (in mm) can be calculated as a relationship between various physical properties of some of the component materials. Preferably, the disposal distance 440 is greater than or equal to X*(body CLTE/barrier CLTE)+C. In a preferred embodiment, X is a constant that ranges from about 1.0 to 4.0, more preferably from about 2.5 to 3.8, and most preferably from about 3.0 to 3.75. In a preferred embodiment, C is a constant that ranges from about 0.5 to 10.0, more preferably from about 1.0 to 5.0, and most preferably from about 1.25 to 3.0.

In a second preferred embodiment, a desirous disposal distance 440 can be calculated as ratio of the $L_{BP}$ (at least as measured within about 25.0 mm of the rounded connector corner 430) to the disposal distance 440 (disposal distance 440/$L_{BP}$=ratio). Preferably, the ratio is about 0.02 to 0.1, more preferably about 0.03 to 0.08, and most preferably about 0.035 to 0.044.

In a third preferred embodiment, the radius 432 (of the at least one rounded connector corner 430) is determined as a ratio of the radius 432 to the $L_{BP}$ (at least as measured within about 25.0 mm of the rounded barrier perimeter corners 420) (radius 432/$L_{BP}$=ratio). Preferably, the ratio is about 0.000172 to 0.0259, more preferably about 0.001000 to 0.015000, and most preferably about 0.001724 to 0.00517.

Other relationships contemplated in the present invention include: The distance between the interface region 410 and the buss bar region 311 relative to the length ($L_{BP}$, particularly within about 25.0 mm of the region 410) of the body portion 200 can be expressed as a ratio. Preferably, this ratio ranges from about 0.00348 to 0.0438, more preferably from about 0.01000 to 0.03000, and most preferably from about 0.01500 to 0.02500. Furthermore, the relationship of the thickness of the body portion (T) in relation to the length ($L_{BP}$, particularly within about 25.0 mm of the region 410) is contemplated as a ratio (T/$L_{BP}$). Preferably, this ratio ranges from about 0.0017 to 0.035, more preferably from about 0.0150 to 0.030, and most preferably from about 0.0100 to 0.0200.

Bending and Cant Relationships

This section concentrates on certain aspects of the relationships between the MPCA 100, MPCA subassembly 101 and the body portion 200. Several illustrative examples and preferred embodiments are detailed herein. One skilled in the art should realize that these examples should not be limiting and the present invention contemplates other potential configurations.

It is believed that it may be desirous to control the overall shape of the PV device 10, particularly to control the cant (or cupping) of the body portion 200 along its width $W_{BP}$. Cupping or cant may be an important consideration when one PV device 10 is laid on (or installed over) another PV device 10 on a surface (e.g. a build structure 451), as illustrated in FIGS. 8, 11 and 12.

FIG. 12 is an illustrative example of a PV device 10 that is not cupped and would not be desirous. FIG. 11 shows a PV device 10 that is cupped in a desirable fashion. The amount of cupping 454 (e.g. distance from the plane of the next lower structure 451 or another PV device 10—cupping value) preferably ranges from about 3.0 mm to about 30 mm, more preferably from about 5.0 mm to 25.0 mm, and most preferably from about 7.0 mm to 15 mm.

It is believed that to effectuate manufacturing a PV device 10 that meets the some or all of the needs discussed above, additional design considerations may be necessary. The present invention contemplates that given the material and geometric relationships discussed in the previous section, it may be beneficial to include a bending region 210. Of particular note is that as the percent difference in the subassembly CLTE to that of the body portion material increase, the need for the bending region increases. These ratios and their influence on component stresses are significant in isolation of stress loadings. It may be advantageous to locate these regions in such a way that manufacturing and installation loadings do not combine with stresses due to thermal loadings and the relative CLTE's of the materials. This may also occur at a critical region of the device that includes critical electrical components (connector, bus bars, etc.) that influence the part to disadvantaged thicknesses and lengths. Examples of the location and/or the configuration of the bending region 210 are presented below. It is contemplated that any or all combinations of aspects from each example may be combined if so desired.

It is preferred that this bending region be located very near (e.g. within about 25.0 mm) the fastening location (or fastening zone 450) of the device 10, such that when it is fastened (e.g. with mechanical fasteners such as nails 452, screws or the like) to the mounting surface (e.g. building structure 451) that the uppermost and lowermost edges are in full contact with the mounting surface or the other devices. It is believed that this maybe important for many aspects of a roofing device and a photovoltaic device. Examples include water sealability, resistance to wind loading, stability in wind and vibration, and maintaining a uniform position on the mounting surface through environmental and servicing situations. It is therefore very desirous to have a bending region such that edges are properly pre-loaded to meet these needs. Without the bending region, excessive force may be needed to fasten the device to the mounting structure. Alternately, if the part has insufficient bending resistance or improper bend (or cant), sufficient edge contact cannot be maintained.

In a first illustrative example, shown in FIG. 9, a bending region 210 is created with the PV device 10 by reducing the body portion 200 thickness (at least locally) and wherein the MPCA subassembly 101 steps in a direction towards the top surface of the body portion 200. It is contemplated that this bending region 210 preferably starts at least about 5.0 mm away from the interface region and continues to at least about to the top of the MPCA subassembly 101, although it could continue further up the body portion 200.

In a first preferred embodiment, the bending region 210 generally spans across at least about 70% of the length of PV device 10 in an area that the connector housing 310 is and/or the area where the buss bar region 311 is located. The body section 200, in the bending region 210, has a thickness ("$T_{BR}$") of about 2.5 mm to 4.0 mm.

In a second preferred embodiment, a starting point 211 for the bending region 210 is located a distance (in mm) from the interface region and is greater than or equal to X'*(body CLTE/barrier CLTE)+C'. In this preferred embodiment, X' is a constant that ranges from about 1.0 to 5.0, more preferably from about 2.5 to 4.8 and most preferably has a value of 3.75. In this preferred embodiment, C' is a constant that ranges from about 1.0 to 8.0, more preferably from about 2.0 to 6.0 and most preferably from about 3.0 to 5.0.

In a third preferred embodiment, the preferred thickness ("$T_{BR}$") is related to the ratio of the subassembly CLTE to the body CLTE (subassembly CLTE/body CLTE). The thickness ("$T_{BR}$") being about 0.3 to 1.9 times this ratio. Preferably, the ratio is about 1.0 to 5.0, more preferably about 1.5 to 3.5, and most preferably about 1.8 to 2.1.

In a second illustrative example, shown in FIG. 10, the bending region 210 is similar to that of the first example, but the bending region does not continue to the top of the MPCA subassembly 101. The bending region only extends about 50 to 75% of the way to the top of the MPCA subassembly 101 (e.g. in the direction of the width $W_{BP}$).

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

Unless otherwise stated, the coefficient of linear expansion ("CLTE") for the materials and assemblies disclosed herein is determined on a TA Instruments TMA Model 2940 by test method ASTM E1824-08 (2008) in a temperature range of −40° C. and 90° C., at 5° C. per minute, using the standard software provided with the instrument. The skilled artisan will appreciate that a composition may exhibit temperature ranges where the CLTE changes from other regions as the material undergoes thermal transitions. In such a case, the preferred ranges for CLTE above refer to the largest measured CLTE for the compositions, assemblies and/or polygonal barrier layer 122. A photovoltaic device may include many different materials, including materials with very different CLTE. For example, a PV assembly may include solar cells, metal conductors, polymeric encapsulants, barrier materials such as glass, or other disparate materials, all with different CLTE's. The CLTE of a PV assembly may be determined by measuring the dimensions of the assembly at a number of temperatures between −40° C. and 90° C. This temperature range is also assumed for all other physical properties (testing) unless otherwise specified.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" describing combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

What is claimed is:

1. A photovoltaic device comprising:
   a multilayered photovoltaic cell assembly comprised of:
      at least a polygonal barrier layer with a barrier co-efficient of linear expansion, CLTE, and a photovoltaic cell layer disposed inboard of a baffler layer peripheral edge, the barrier layer including a barrier lower surface portion, a barrier upper surface portion and a barrier side surface portion spanning between the upper and lower surface portions with a barrier profile between the upper and lower surface portions and a barrier perimeter spanning about the polygonal barrier layer which forms the barrier layer peripheral edge;
   a body portion comprised of:
      a body material with a body CLTE, the body portion with a body lower surface portion, body upper surface portion and a body side surface portion spanning between the upper and lower surface portions and forming a body peripheral edge, wherein at least a portion of the body portion is molded to a segment of the barrier layer peripheral edge at an interface region;
   wherein (A) the segment of the barrier layer peripheral edge that is molded to the portion of the body portion has rounded barrier perimeter corners within the segment and (B) the device further includes at least one component of a connector assembly at least partially embedded in the body side surface portion and the connector assembly component includes a connector assembly lower surface portion, a connector assembly upper surface portion and a connector assembly side surface portion spanning between the connector assembly upper surface portion and connector assembly lower surface portion which forms a connector assembly peripheral edge, wherein the connector assembly peripheral edge that is closest to the interface region has at least one rounded connector corner, and the connector assembly is in electrical communication with the photovoltaic cell layer;
   wherein the photovoltaic device further comprises a reduced thickness region located between the interface region and fastening region, the reduced thickness region being a region of the photovoltaic device with reduced thickness oriented along a dimension which is parallel to a straight portion of the interface region closest to the fastening region.

2. The photovoltaic device of claim 1 wherein the at least one component of the connector assembly is disposed away from the interface region by a disposal distance (in mm) defined by greater than or equal to X*(body CLTE/barrier CLTE)+C, wherein X ranges from 1.0 to 4.0 and C ranges from 0.5 to 10.0.

3. The photovoltaic device of claim 1 wherein the at least one component of the connector assembly is disposed away from the interface region by a disposal distance calculated as a ratio (disposal distance/body portion length $L_{BP}$), wherein the ratio ranges between 0.02 to 0.1.

4. The photovoltaic device of claim 1, wherein the rounded barrier perimeter corners have a radius that is determined as a ratio of the body portion length, $L_{BP}$, the $L_{BP}$ as measured within 25.0 mm of the rounded barrier perimeter corners, to the radius (radius/$L_{BP}$), wherein the ratio ranges from 0.00345 to 0.0862.

5. The photovoltaic device of claim 1, wherein the barrier layer comprises glass.

6. The photovoltaic device of claim 1, wherein the rounded barrier perimeter corners have a radius of at least 2.0 mm.

7. The photovoltaic device of claim 1, wherein the at least one rounded connector corner has a radius of at least 1.0 mm.

8. The photovoltaic device of claim 1, wherein the body material comprises a polypropylene containing up to 65% by weight of a filler.

9. The photovoltaic device of claim 1, wherein the body CLTE and the barrier CLTE is within 1.5 to 10 times one another.

10. The photovoltaic device of claim 1, wherein body material has a modulus of greater than 0.3 GPa as measured at 25°C.

11. The photovoltaic device according to claim 8, wherein the filler comprises glass fibers.

12. The photovoltaic device of claim 1, wherein the interface region is free from cracks protruding through the body side surface portion after being subjected to a Temperature Cycling Test pursuant to IEC61646.

13. The photovoltaic device of claim 1, wherein the photovoltaic device includes a bending region that has a starting point away from the interface region by a distance defined by greater than or equal to a Constant X'*(body CLTE/barrier CLTE)+a Constant C', wherein X' ranges from 1.0 to 5.0 and C' ranges from 1.0 to 8.0.

14. The photovoltaic device according to claim 1, wherein the body portion is injection molded about at least a portion of the multilayered photovoltaic cell assembly and the connectors.

15. The photovoltaic device according to claim 14, wherein the body portion is formed about at least a portion of the multilayered photovoltaic cell assembly and the connectors by molding.

16. The photovoltaic device according to claim 1, wherein the photovoltaic device has a cupping value that ranges from 3.0 mm to 30.0 mm.

17. The photovoltaic device according to claim 1, wherein the connector is at least partially molded in the body side surface portion.

18. The photovoltaic device according to claim 1, wherein the polygonal barrier layer comprises glass or polycarbonate.

19. The photovoltaic device according to claim 18, wherein the body material exhibits a CLTE of about 25 to about 70 mm/mm ° C.; a flex modulus of about 500 to about 7000 MPa and an elongation at break of at least 3 to not more than 50.

* * * * *

UNITED STATES PATENT AND TRADEMARK OFFICE
CERTIFICATE OF CORRECTION

PATENT NO. : 8,912,426 B2  Page 1 of 1
APPLICATION NO. : 13/044593
DATED : December 16, 2014
INVENTOR(S) : Michael E. Mills It is certified that error appears in the above-identified patent and that said Letters Patent is hereby corrected as shown below:

In the Claims

Column 15, Claim 1, Line 30, "Baffler" should be "Barrier"

Signed and Sealed this
Thirty-first Day of March, 2015

Michelle K. Lee
*Director of the United States Patent and Trademark Office*